US012649199B2

(12) United States Patent
Saini et al.

(10) Patent No.: US 12,649,199 B2
(45) Date of Patent: Jun. 9, 2026

(54) WEDGE BONDING TOOLS HAVING A GROOVE SURFACE WITH LASER PULSED HOLES

(71) Applicant: Kulicke and Soffa Industries, Inc., Fort Washington, PA (US)

(72) Inventors: Tanbir Saini, Long Beach, CA (US); Amey Vidvans, Newport Beach, CA (US); Christoph B. Luechinger, Irvine, CA (US); Frank Daniels, Irvine, CA (US)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 0 days.

(21) Appl. No.: 19/037,810

(22) Filed: Jan. 27, 2025

(65) Prior Publication Data

US 2025/0253286 A1     Aug. 7, 2025

Related U.S. Application Data

(60) Provisional application No. 63/549,989, filed on Feb. 5, 2024.

(51) Int. Cl.
| | |
|---|---|
| *H01L 23/00* | (2006.01) |
| *B23K 20/10* | (2006.01) |
| *H10W 72/00* | (2026.01) |
| *H10W 72/50* | (2026.01) |

(52) U.S. Cl.
CPC ..... *B23K 20/106* (2013.01); *H10W 72/07141* (2026.01); *H10W 72/07533* (2026.01); *H10W 72/5524* (2026.01); *H10W 72/5525* (2026.01)

(58) Field of Classification Search
CPC .............. B23K 20/10–106; B23K 20/004–007
See application file for complete search history.

(56) References Cited

U.S. PATENT DOCUMENTS

| | | | | |
|---|---|---|---|---|
| 4,030,657 A | * | 6/1977 | Scheffer .................. | H01L 24/85 228/110.1 |
| 5,288,007 A | * | 2/1994 | Interrante .............. | B23K 20/10 228/205 |
| 5,931,368 A | * | 8/1999 | Hadar ..................... | C23C 14/06 228/4.5 |
| 8,820,609 B2 | | 9/2014 | Walker | |
| D824,969 S | * | 8/2018 | Alfaro .......................... | D15/144 |

(Continued)

FOREIGN PATENT DOCUMENTS

| | | | | |
|---|---|---|---|---|
| CN | 116169040 | 5/2023 | | |
| JP | 2837377 B2 | * | 12/1998 | ............. B23K 20/10 |

(Continued)

OTHER PUBLICATIONS

International Search Report for PCT application No. PCT/US2025/013131 completed on Apr. 24, 2025.

*Primary Examiner* — Keith Walker
*Assistant Examiner* — Carlos J Gamino
(74) *Attorney, Agent, or Firm* — Christopher M. Spletzer, Sr.

(57) ABSTRACT

A wedge bonding tool is provided. The wedge bonding tool includes a body portion and a tip portion at a terminal end of the body portion. The tip portion includes a groove surface defining a groove. The groove is configured to receive a wire during a wire bonding operation. The groove surface includes a plurality of laser scribed recesses.

20 Claims, 11 Drawing Sheets

(56)            References Cited

U.S. PATENT DOCUMENTS

| | | | |
|---|---|---|---|
| 10,864,597 B2 * | 12/2020 | Yoshida | B24B 19/02 |
| 11,007,602 B2 * | 5/2021 | Idota | B23K 20/10 |
| 11,756,919 B2 * | 9/2023 | Imai | B23K 20/005 |
| | | | 156/580.2 |
| 2005/0045692 A1 * | 3/2005 | Harun | B23K 20/005 |
| | | | 228/110.1 |
| 2005/0218188 A1 * | 10/2005 | Lee | B23K 20/005 |
| | | | 228/4.5 |
| 2008/0314963 A1 * | 12/2008 | Itzhaky | B23K 20/106 |
| | | | 228/4.5 |
| 2009/0127317 A1 * | 5/2009 | Siepe | B23K 20/004 |
| | | | 228/110.1 |
| 2011/0290859 A1 * | 12/2011 | Delsman | B23K 20/007 |
| | | | 228/1.1 |
| 2017/0120372 A1 * | 5/2017 | Poncelet | B23K 26/40 |
| 2018/0019224 A1 * | 1/2018 | Shigeyoshi | B23K 20/10 |
| 2019/0237427 A1 | 8/2019 | Klaerner et al. | |
| 2020/0395333 A1 | 12/2020 | Imai | |
| 2022/0193816 A1 | 6/2022 | Unger et al. | |
| 2024/0335901 A1 | 10/2024 | Suzuki | |
| 2025/0125303 A1 * | 4/2025 | Ownby | H01L 24/48 |
| 2025/0201674 A1 * | 6/2025 | McPherson | H01L 23/49541 |
| 2025/0289074 A1 * | 9/2025 | Walker | B23K 20/10 |

FOREIGN PATENT DOCUMENTS

| | | | | |
|---|---|---|---|---|
| JP | 2014116334 A | * | 6/2014 | H10W 72/0711 |
| WO | 2023058110 | | 4/2023 | |

* cited by examiner

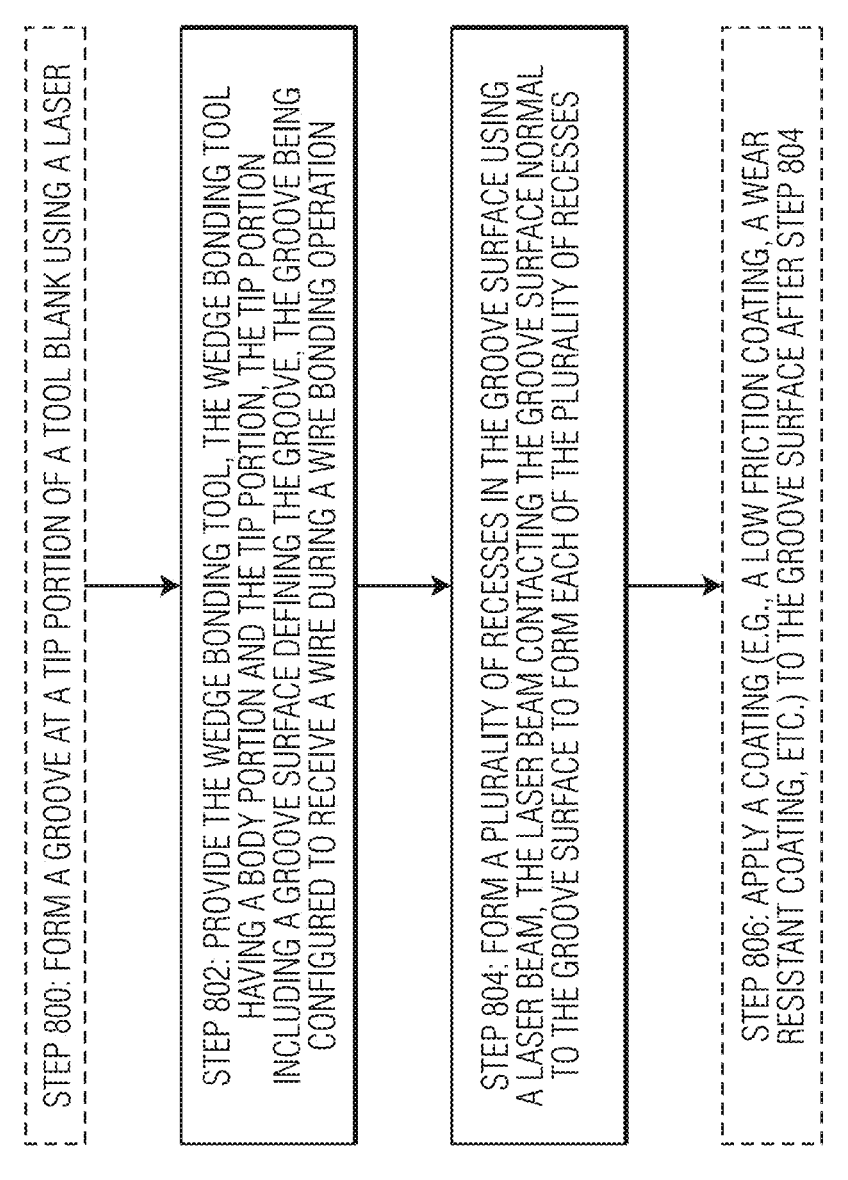

STEP 800: FORM A GROOVE AT A TIP PORTION OF A TOOL BLANK USING A LASER

STEP 802: PROVIDE THE WEDGE BONDING TOOL, THE WEDGE BONDING TOOL HAVING A BODY PORTION AND THE TIP PORTION, THE TIP PORTION INCLUDING A GROOVE SURFACE DEFINING THE GROOVE, THE GROOVE BEING CONFIGURED TO RECEIVE A WIRE DURING A WIRE BONDING OPERATION

STEP 804: FORM A PLURALITY OF RECESSES IN THE GROOVE SURFACE USING A LASER BEAM, THE LASER BEAM CONTACTING THE GROOVE SURFACE NORMAL TO THE GROOVE SURFACE TO FORM EACH OF THE PLURALITY OF RECESSES

STEP 806: APPLY A COATING (E.G., A LOW FRICTION COATING, A WEAR RESISTANT COATING, ETC.) TO THE GROOVE SURFACE AFTER STEP 804

FIG. 8

WEDGE BONDING TOOLS HAVING A GROOVE SURFACE WITH LASER PULSED HOLES

CROSS-REFERENCE TO RELATED APPLICATION

This application claims the benefit of U.S. Provisional Application No. 63/549,989 filed on Feb. 5, 2024, the content of which is incorporated herein by reference.

FIELD

The invention relates to wedge bonding tools for wire bonding systems, and related methods.

BACKGROUND

In the assembly of electronic devices, wire bonding continues to be a primary method of providing electrical interconnection between two locations (e.g., between a die pad of a semiconductor die and a lead of a leadframe). More specifically, using a wire bonding system (also known as a wire bonding machine), wire loops are formed between respective locations to be electrically interconnected. The primary methods of forming wire loops are ball bonding and wedge bonding. In forming wire bonds between (a) the ends of the wire loop and (b) the bond site (e.g., a die pad, a lead, etc.), varying types of bonding energy may be used, including, for example, ultrasonic energy, thermosonic energy, thermocompressive energy, amongst others. Wire bonding systems are also used to form conductive bumps from portions of wire.

In wedge bonding applications, certain types of wire bonding tools are used. For example, wedge bonding tools including a groove (e.g., a U-shaped groove, a V-shaped groove, etc.) may be used in certain applications (e.g., aluminum wire bonding applications, copper wire bonding applications, etc.). Such a groove may be used to couple the wedge bonding tool to the wire, thereby transferring the tool tip motion from the wedge bonding tool to the wire during formation of a wire bond. U.S. Pat. No. 8,820,609 (entitled "WIRE BONDING TOOL"), assigned to Kulicke and Soffa Industries, Inc., illustrates examples of such wedge bonding tools.

It would be desirable to provide improved wedge bonding tools, including those defining a groove at a tip portion of the tool.

SUMMARY

According to an exemplary embodiment of the invention, a wedge bonding tool is provided. The wedge bonding tool includes a body portion and a tip portion at a terminal end of the body portion. The tip portion includes a groove surface defining a groove. The groove is configured to receive a wire during a wire bonding operation. The groove surface includes a plurality of laser scribed recesses.

According to another exemplary embodiment of the invention, another wedge bonding tool is provided. The wedge bonding tool includes a body portion and a tip portion at a terminal end of the body portion. The tip portion includes a groove surface defining a groove. The groove is configured to receive a wire during a wire bonding operation. The groove surface includes a plurality of laser scribed recesses. The wedge bonding tool includes a coating applied to the groove surface.

According to yet another exemplary embodiment of the invention, a wire bonding system is provided. The wire bonding system includes a bond head assembly, a support structure for supporting a workpiece, and a wedge bonding tool configured to be carried by the bond head assembly, wherein the wedge bonding tool has a body portion and a tip portion at a terminal end of the body portion, the tip portion including a groove surface defining a groove configured to receive a wire during a wire bonding operation, the groove surface including a plurality of laser scribed recesses.

According to other embodiments of the invention, the wedge bonding tools and wire bonding system recited in the three immediately preceding paragraphs may have any one or more of the following features: a portion of the groove surface including the plurality of laser scribed recesses has a surface texture, the surface texture having a mean area roughness ($S_a$) of 0.03-1.5 µm; a portion of the groove surface including the plurality of laser scribed recesses has a surface texture, the surface texture having a mean area roughness ($S_a$) of 0.1-0.9 µm; a portion of the groove surface including the plurality of laser scribed recesses has a surface texture, the surface texture having a mean area roughness ($S_a$) of 0.3-1.5 µm; the tip portion includes a carbide material; the tip portion includes a cubic boron nitride material; a coating applied to the groove surface; the coating has a thickness of 0.5-10 µm; the coating has a thickness of 5-10 µm; the coating has a thickness of 1-5 µm; the coating has a thickness of 1-20 µm; the coating has a thickness of 10-20 µm; the coating includes a diamond-like carbon material and has a thickness of 0.5-5 µm; the coating includes a cubic boron nitride material and has a thickness of 10-100 µm; the coating includes a cubic boron nitride material and has a thickness of 1-50 µm; the coating includes a cubic boron nitride material and has a thickness of 1-10 µm; the coating includes a tetrahedral amorphous carbon material and has a thickness of 0.5-6 µm; the coating includes a titanium nitride material and has a thickness of 1-10 µm; the coating includes a chromium nitride material and has a thickness of 0.2-7 µm; the coating includes a chromium nitride material and has a thickness of 1-15 µm; a depth of each of the plurality of laser scribed recesses extends along an axis substantially perpendicular to the groove surface; a depth of each of the plurality of laser scribed recesses is at least ten times larger than a width of each of the plurality of laser scribed recesses; a portion of the groove surface including the plurality of laser scribed recesses has a surface texture, wherein a plurality of peaks included in the portion of the groove surface each have a width of 2-50 µm; and a portion of the groove surface including the plurality of laser scribed recesses has a first surface texture, and another portion of the groove surface has a second surface texture different from the first surface texture.

According to yet another exemplary embodiment of the invention, a method of processing a wedge bonding tool is provided. The method includes steps of: (a) providing a wedge bonding tool, the wedge bonding tool having a body portion and a tip portion at a terminal end of the body portion, the tip portion including a groove surface defining a groove, the groove being configured to receive a wire during a wire bonding operation; and (b) forming a plurality of recesses in the groove surface using a laser beam, the laser beam contacting the groove surface normal to the groove surface to form each of the plurality of recesses.

According to yet another exemplary embodiment of the invention, another method of processing a wedge bonding tool is provided. The method includes the steps of: (a)

providing a wedge bonding tool, the wedge bonding tool having a body portion and a tip portion at a terminal end of the body portion, the tip portion including a groove surface defining a groove, the groove being configured to receive a wire during a wire bonding operation; (b) forming a plurality of recesses in the groove surface using a laser beam; and (c) applying a coating to the groove surface.

According to other embodiments of the invention, the methods recited in the two immediately preceding paragraphs may have any one or more of the following features: step (b) includes reflecting the laser beam by at least one optical element prior to contacting the groove surface; step (b) includes pulsing the laser beam while having relative movement between the laser beam and the groove surface to form the plurality of recesses; step (b) includes pulsing the laser beam while moving the laser beam with respect to the groove surface to form the plurality of recesses; step (b) includes forming the plurality of recesses to have a depth that extends along an axis substantially perpendicular to the groove surface; step (b) includes forming the plurality of recesses to have a depth at least ten times larger than a width of each of the plurality of recesses; step (b) includes forming the plurality of recesses such that the groove surface including the plurality of recesses has a surface texture, wherein a plurality of peaks included in the portion of the groove surface each have a width of 2-50 μm; step (b) includes forming the plurality of recesses such that the groove surface including the plurality of recesses has a first surface texture, and another portion of the groove surface has a second surface texture different from the first surface texture; step (b) includes pulsing the laser beam while moving the groove surface with respect to the laser beam to form the plurality of recesses; the groove surface includes a first wall portion and a second wall portion, and wherein step (b) includes substep (b1) forming a first portion of the plurality of recesses in the first wall portion, and substep (b2) forming a second portion of the plurality of recesses in the second wall portion; step (b) includes providing relative movement between the laser beam and the groove surface after step (b1) and before step (b2) such that the second wall portion is perpendicular to the laser beam during step (b2); step (b) includes forming the plurality of recesses such that a surface texture of a portion of the groove surface including the plurality of recesses has a mean area roughness ($S_a$) between 0.03-1.5 μm; step (b) includes forming the plurality of recesses such that a surface texture of a portion of the groove surface including the plurality of recesses has a mean area roughness ($S_a$) between 0.1-0.9 μm; step (b) includes forming the plurality of recesses such that a surface texture of a portion of the groove surface including the plurality of recesses has a mean area roughness ($S_a$) between 0.3-1.5 μm; a step of forming the groove of the wedge bonding tool, prior to step (a), using a laser; a step (c) of applying a coating to the groove surface after step (b); step (c) includes applying the coating via chemical vapor deposition; step (c) includes applying the coating via physical vapor deposition; step (c) includes applying the coating via thermal spray; step (c) includes applying the coating to a thickness of 0.5-10 μm; step (c) includes applying the coating to a thickness of 5-10 μm; step (c) includes applying the coating to a thickness of 1-5 μm; step (c) includes applying the coating to a thickness of 1-20 μm; step (c) includes applying the coating to a thickness of 10-20 μm; step (c) includes applying the coating including a diamond-like carbon material to a thickness of 0.5-5 μm; step (c) includes applying the coating including a cubic boron nitride material to a thickness of 10-100 μm; step (c) includes applying the coating including a cubic boron nitride material to a thickness of 1-50 μm; step (c) includes applying the coating including a cubic boron nitride material to a thickness of 1-10 μm; step (c) includes applying the coating including a tetrahedral amorphous carbon material to a thickness of 0.5-6 μm; step (c) includes applying the coating including a titanium nitride material to a thickness of 1-10 μm; step (c) includes applying the coating including a chromium nitride material to a thickness of 0.2-7 μm; step (c) includes applying the coating including a chromium nitride material to a thickness of 1-15 μm; and during step (b), the laser beam contacts the groove surface normal to the groove surface to form each of the plurality of recesses.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawings are the following figures:

FIG. 8 is a flow diagram illustrating a method of processing a wedge bonding tool in accordance with an exemplary embodiment of the invention.

DETAILED DESCRIPTION

In accordance with various exemplary embodiments of the invention, texturing of a groove surface of a wedge bonding tool (e.g., a wedge bonding tool configured for bonding copper wire, a wedge bonding tool configured for bonding aluminum wire, etc.) is performed using a laser beam (e.g., by laser micromachining). After texturing, a coating (e.g., a low friction coating) may be applied to the groove surface.

The texturing and/or coating may provide: improved wedge bonding tool performance; improved wedge bonding tool wear resistance; improved coupling between a wedge bonding tool and a wire; and/or an improved ability to form wire bonds on sensitive surfaces. While the invention has applicability to various wire types and wire materials, aspects of the invention have particular applicability to copper wire bonding and/or aluminum wire bonding.

In accordance with various exemplary embodiments of the invention, laser machining (e.g., laser micro machining) may be accomplished using a laser machining system including 5 axis machining capabilities.

Laser texturing of the groove surface may enhance energy transfer from the wedge bonding tool to the wire (and substrate to which the wire is being bonded). Certain exemplary laser machining techniques may be referred to as "blasting". Selection of the blasting density, and laser parameters, may be used to enable a surface morphology useful in connection with a specific wire bonding application.

Application of a coating (e.g., a low friction coating) to the groove surface may reduce damage to a bonding surface of a substrate (e.g., a die pad) during lift off after formation of a wire bond. Certain coatings may be used to: reduce a stiction force between the groove surface of the wedge bonding tool and a wire; reduce debris generation during wire bonding; and/or to reduce tool wear.

Examples of coatings (e.g., low friction coatings) that may be applied to the groove surface (and/or other portion of the wedge bonding tool) include, but are not limited to: a diamond-like carbon (DLC) material (with or without an interlayer such as Cr), a cubic boron nitride (c-BN) material, a tetrahedral amorphous carbon (ta-C) material (with or without an interlayer such as Cr), a titanium nitride (TiN) material, and/or a chromium nitride (CrN) material. The coating may be applied to any desired portion of the wedge bonding tool, such as: the groove surface, the tip portion of the wedge bonding tool including the groove surface; and/or the entire wedge bonding tool. The coating may be applied using techniques such as chemical vapor deposition (CVD), physical vapor deposition (PVD), thermal spray, among others.

Figures 1A, 1B:
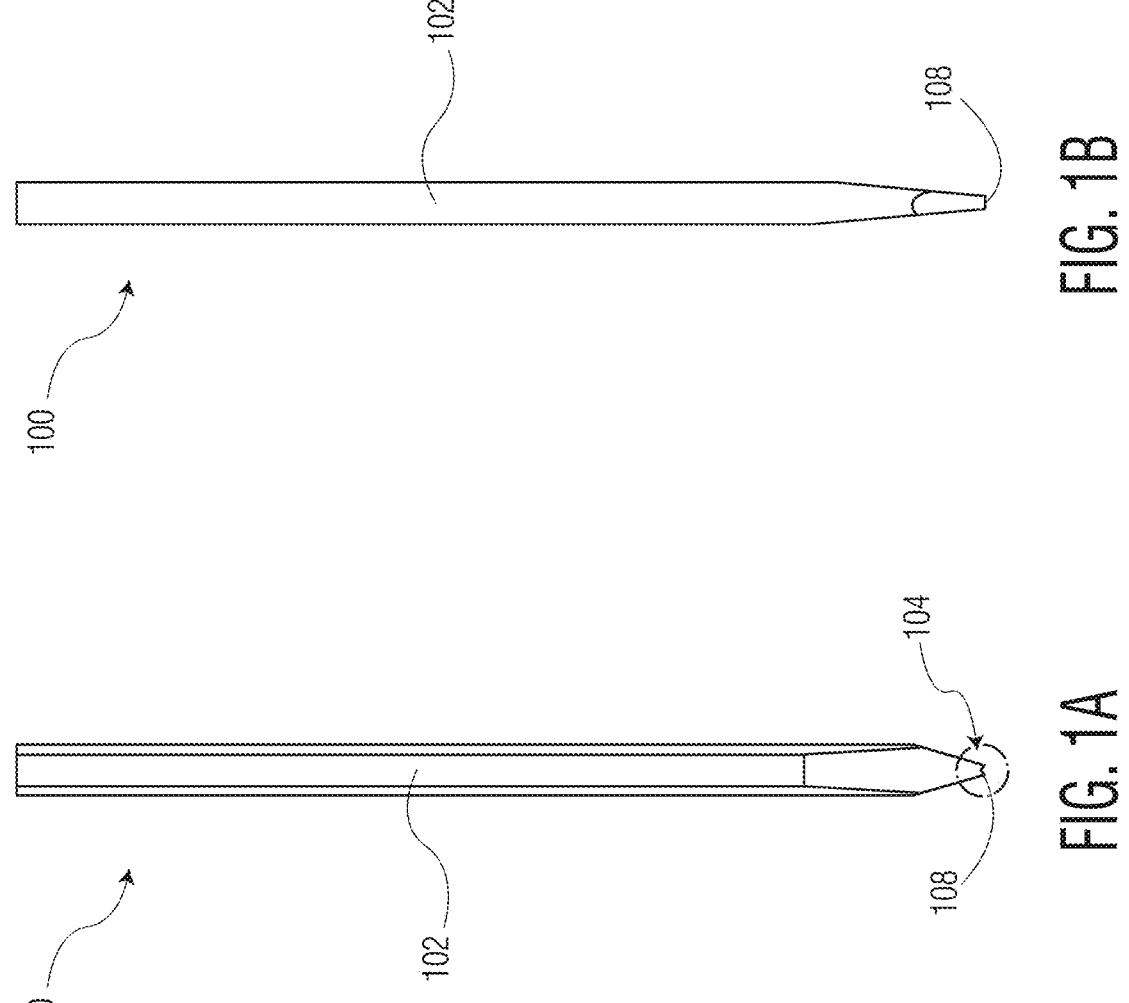
FIGS. 1A-1B are front and side views of a wedge bonding tool useful in illustrating various exemplary embodiments of the invention.

FIGS. 1A-1B illustrate a wedge bonding tool 100 including a body portion 102 and a tip portion 104 at a terminal end of body portion 102. Tip portion 104 includes a groove surface 106 (described in more detail herein). Groove surface 106 defines a groove 108. FIG. 1A is a front view of wedge bonding tool 100, and FIG. 1B is a side view of wedge bonding tool 100. Wedge bonding tool 100 is used to bond a wire to a bonding location in a wire bonding system. More specifically, groove 108 is configured to receive a wire during a wire bonding operation on the wire bonding system. A principal difference between conventional wedge bonding tools and certain wedge bonding tools described herein relates to tip portion 104, and more specifically, to groove surface 106. The wedge bonding tools described below (i.e., wedge bonding tools 100a, 100b, 100c, 100d, 100e, and 100f) each represent a different embodiment of the present invention. Like parts are labeled with similar reference numerals (e.g., tip portion 104 may be represented in each embodiment as 104a, 104b, etc., all referring to different exemplary tip portions).

Figure 2B:
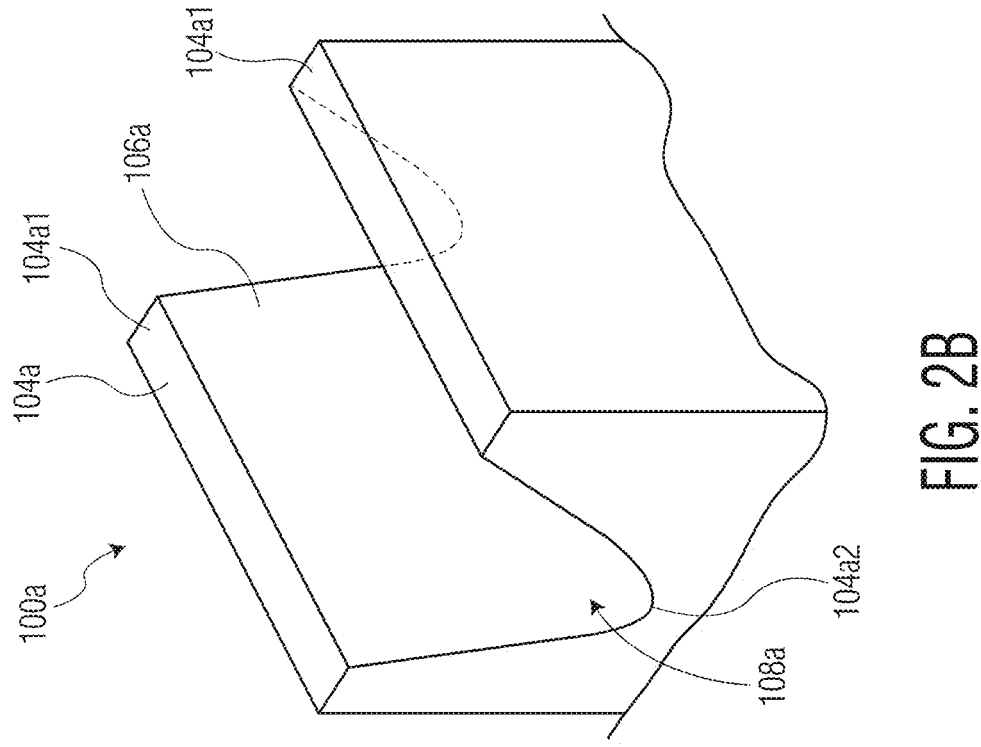
FIG. 2B is a block diagram perspective end view of a wedge bonding tool after machining of the tool blank of FIG. 2A.
Figure 2A:
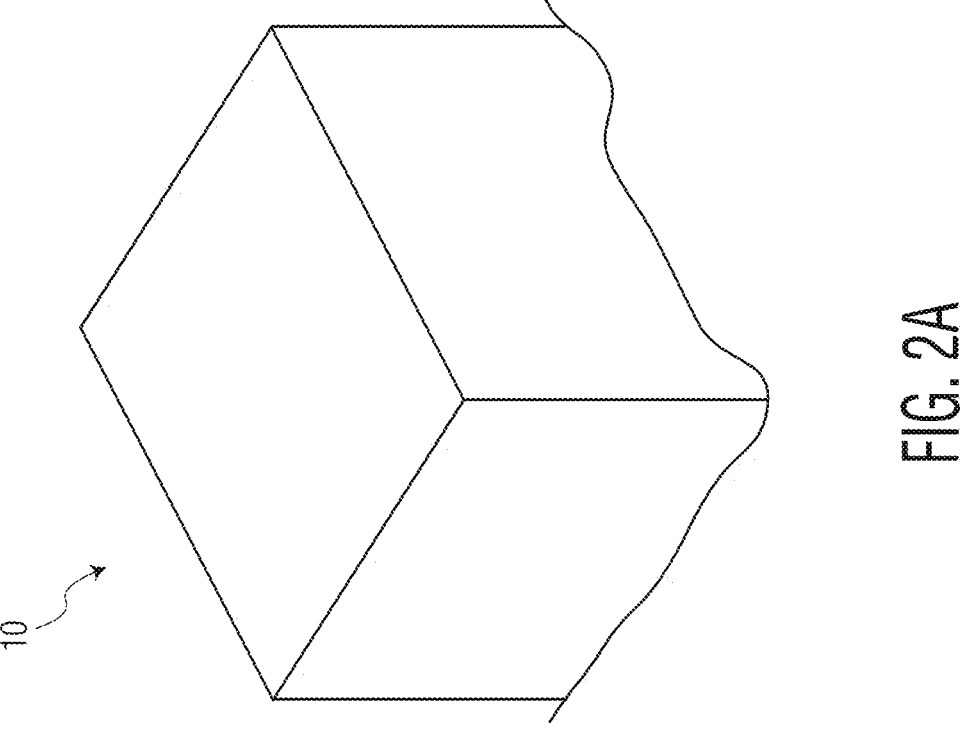
FIG. 2A is a block diagram perspective end view of a tool blank used to form a wedge bonding tool in accordance with an exemplary embodiment of the invention.
Figures 2C, 2D:
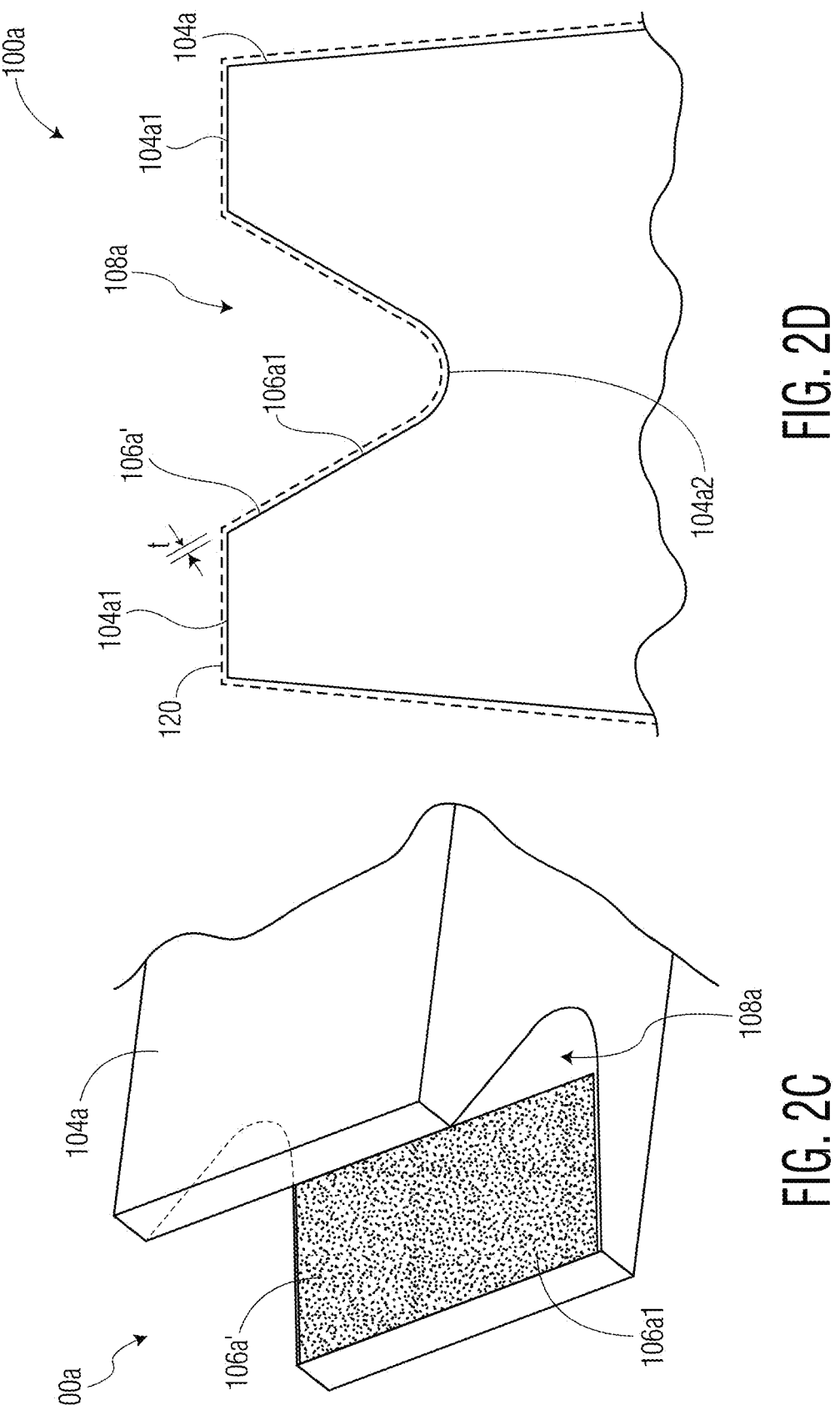
FIG. 2C is a block diagram perspective end view of the wedge bonding tool of FIG. 2B, after formation of a plurality of recesses in a groove surface in accordance with an exemplary embodiment of the invention.
FIG. 2D is a block diagram side view of the wedge bonding tool of FIGS. 2B-2C after a coating has been applied in accordance with an exemplary embodiment of the invention.
Figures 3A, 3B:
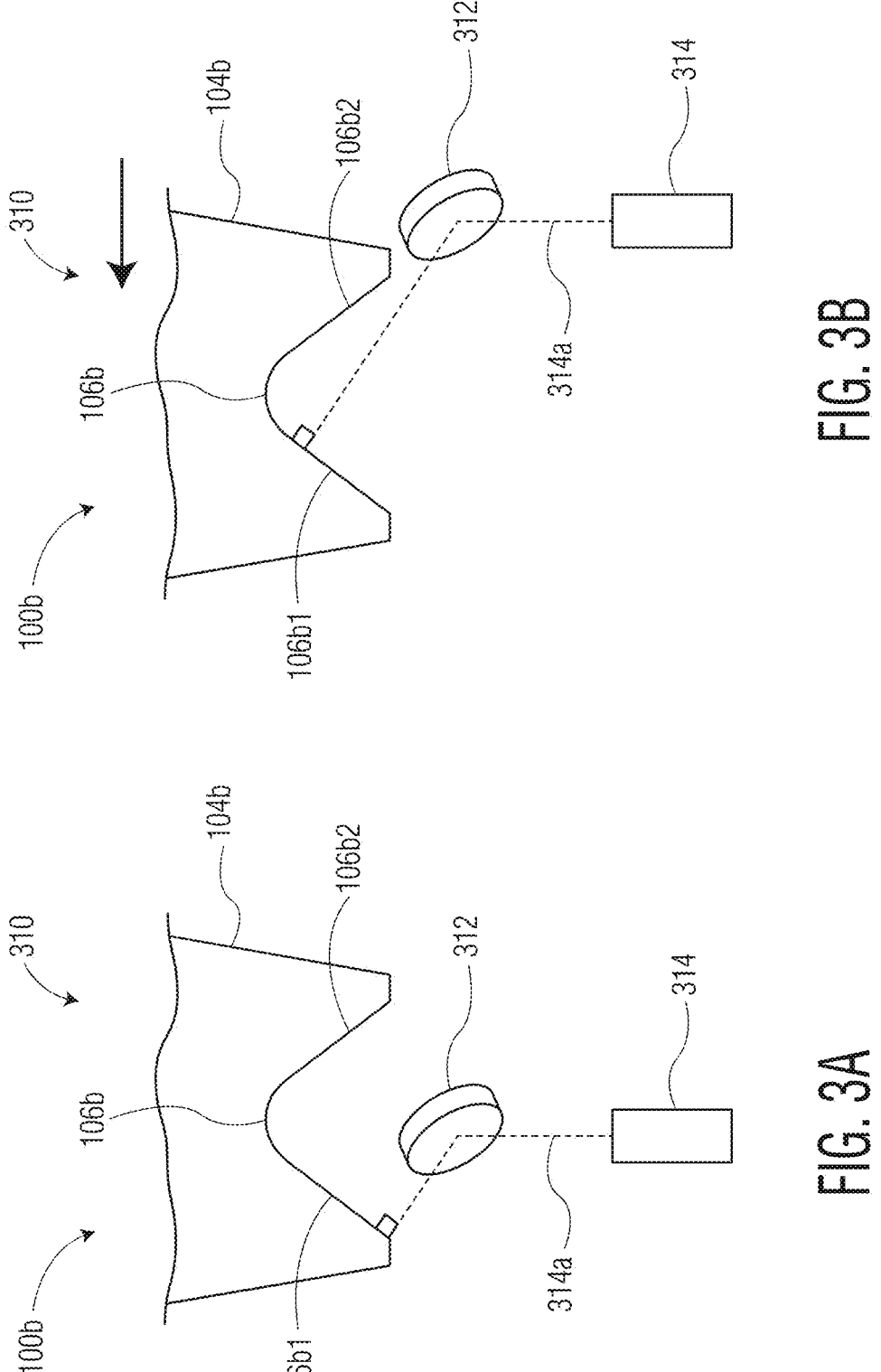
FIGS. 3A-3D are a series of block diagrams illustrating a method of forming a plurality of recesses in a groove surface of a wedge bonding tool in accordance with an exemplary embodiment of the invention.
Figure 3D:
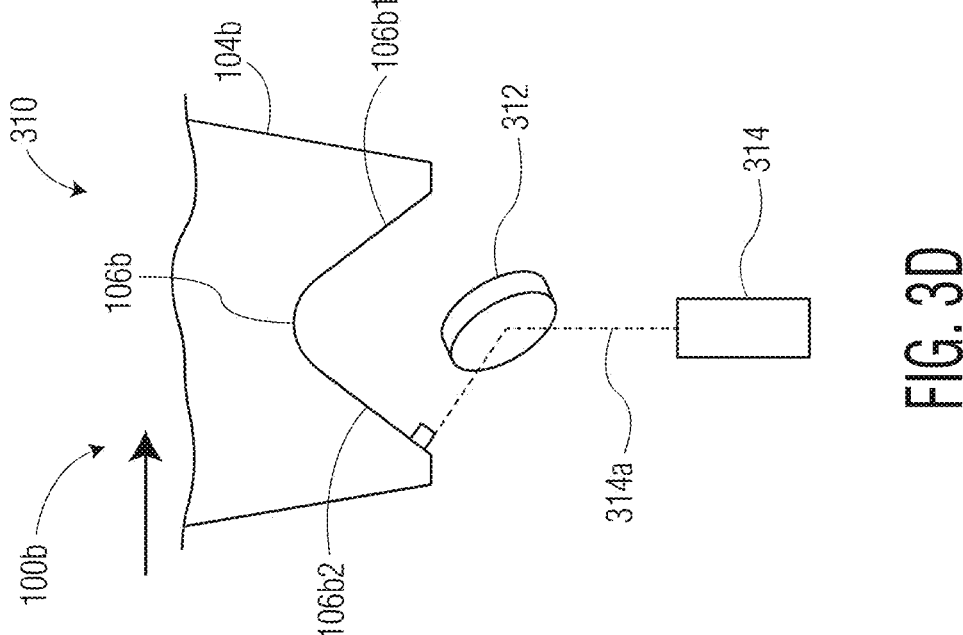
Figure 3C:
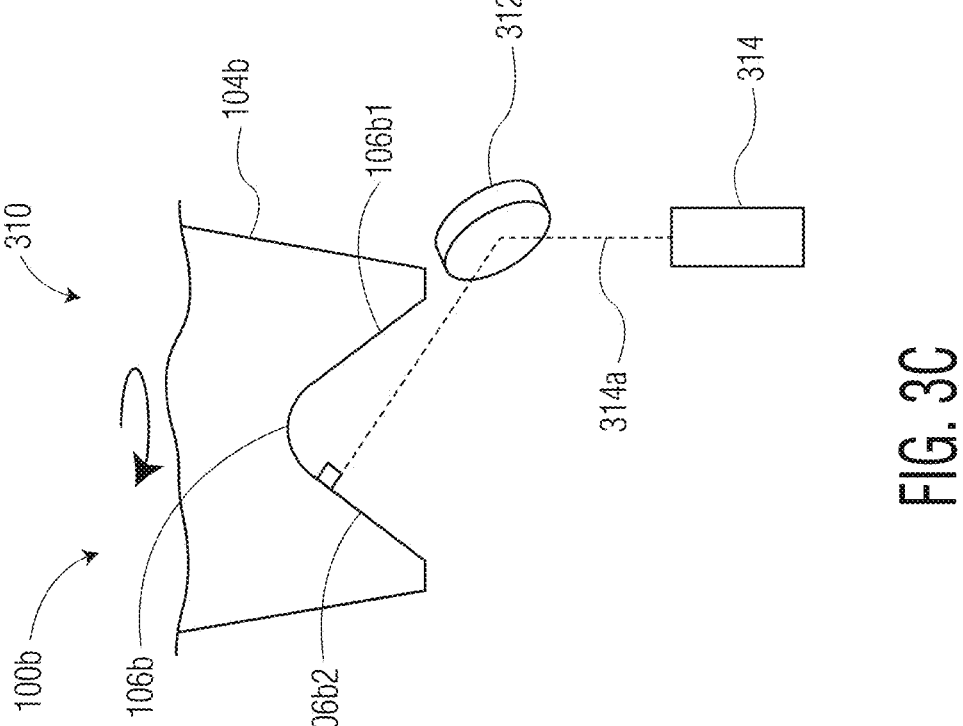
Figures 4A, 4B, 4C:
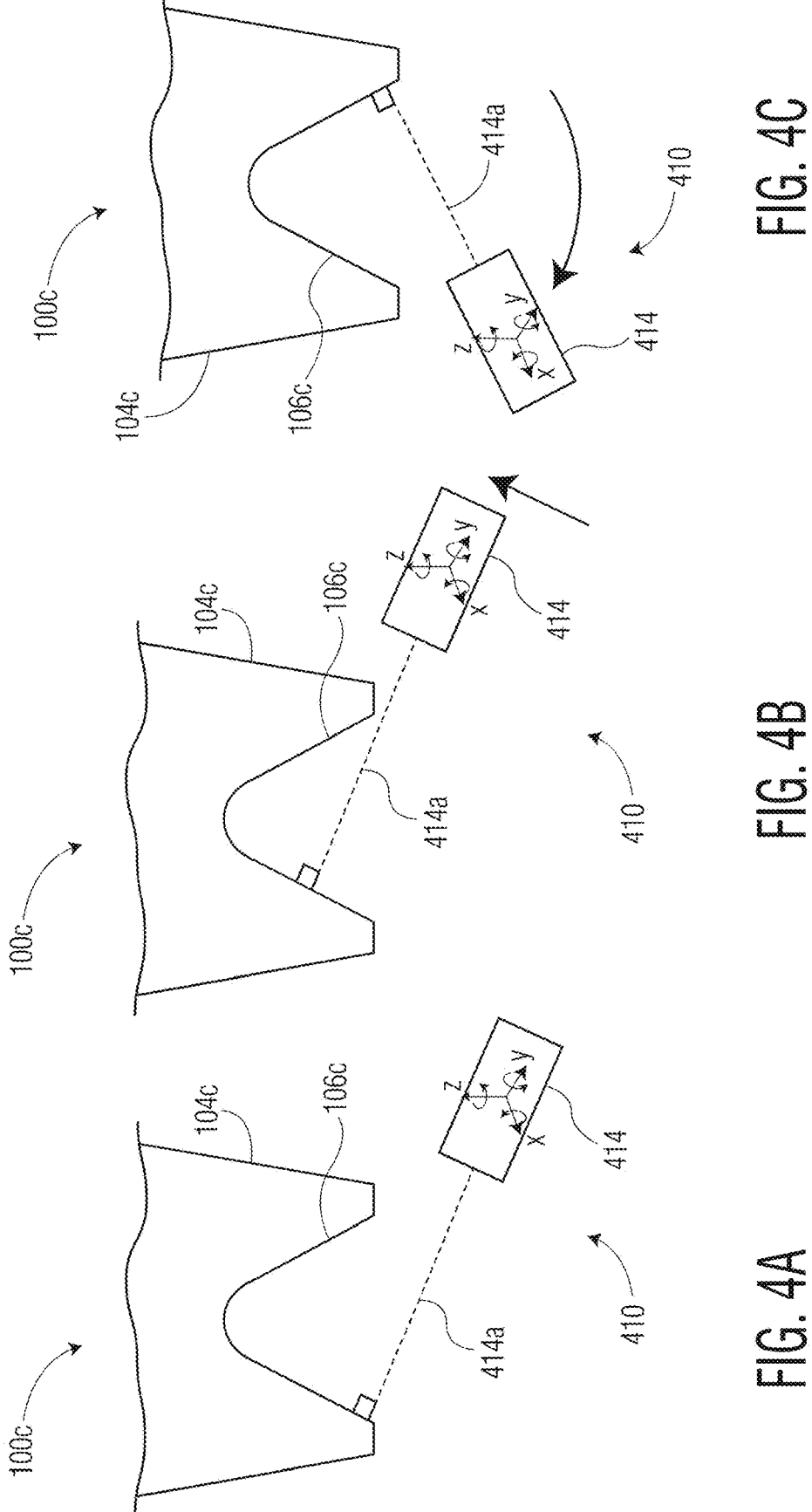
FIGS. 4A-4C are a series of block diagrams illustrating another method of forming a plurality of recesses in a groove surface of a wedge bonding tool in accordance with another exemplary embodiment of the invention.
Figures 5A, 5B:
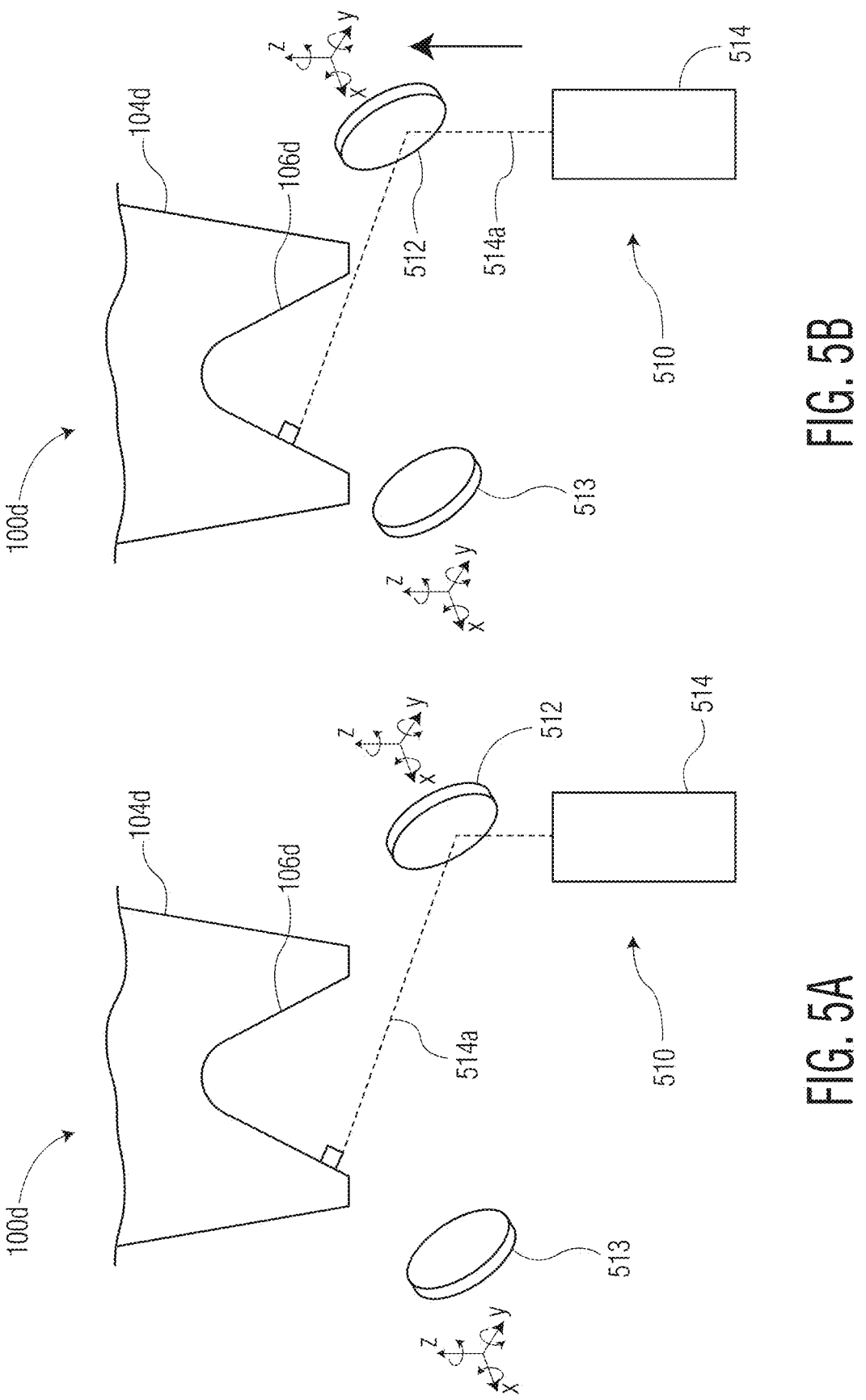
FIGS. 5A-5C are a series of block diagrams illustrating yet another method of forming a plurality of recesses in a groove surface of a wedge bonding tool in accordance with another exemplary embodiment of the invention.
Figure 5C:
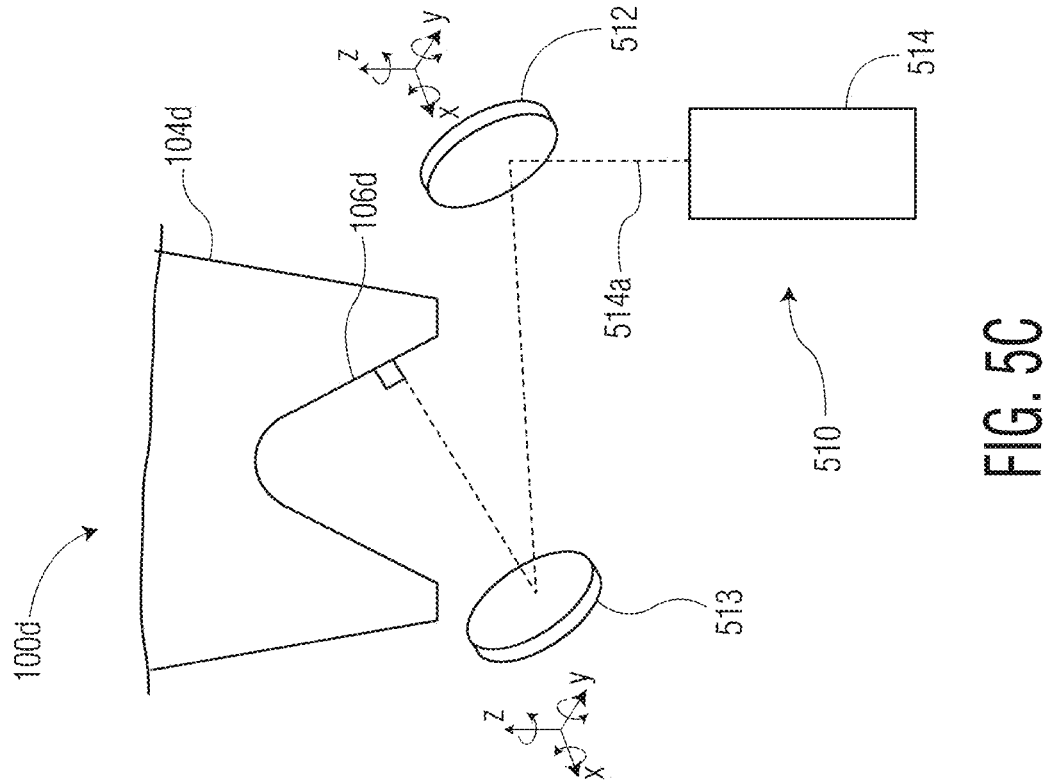
Figures 6A, 6B:
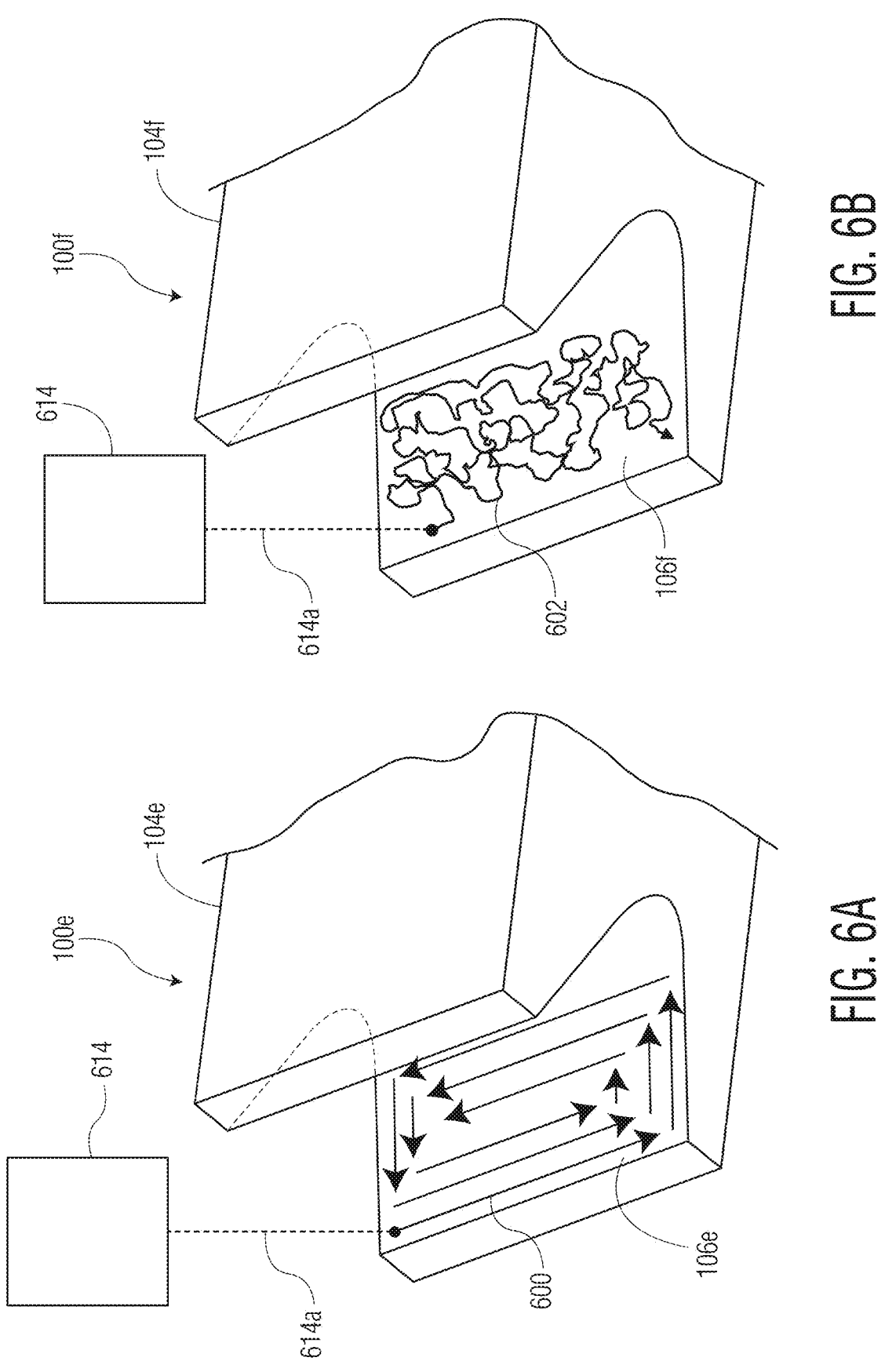
FIGS. 6A-6B are block diagram perspective end views of a wedge bonding tool illustrating various patterns of recesses in a groove surface of the wedge bonding tool in accordance with various exemplary embodiments of the invention.

Various examples of wedge bonding tool 100 including body portion 102 (including distinct tip portions 104) are detailed in FIGS. 2B-2D (where a wedge bonding tool 100a includes a tip portion 104a), FIGS. 3A-3D (where a wedge bonding tool 100b includes a tip portion 104b), FIGS. 4A-4C (where a wedge bonding tool 100c includes a tip portion 104c), FIGS. 5A-5C (where a wedge bonding tool 100d includes a tip portion 104d), FIG. 6A (where a wedge bonding tool 100e includes a tip portion 104e), and FIG. 6B (where a wedge bonding tool 100f includes a tip portion 104f).

FIGS. 2A-2D illustrate an exemplary formation and processing of wedge bonding tool 100a. FIG. 2A illustrates a tool blank 10 configured to be machined (e.g., laser machined) or otherwise altered into a wedge bonding tool. Tool blank 10 may be formed of any type of desired material such as, for example, a carbide material. For example, a laser system may be used to remove material from tool blank 10 such that a groove is formed. Alternatively, tool blank 10 may include a body portion and be configured to be joined together with a tip portion (e.g., joined via brazing, welding, adhesive, etc.). FIG. 2B illustrates tip portion 104a of wedge bonding tool 100a after a machining process removed material to create a groove surface 106a in tip portion 104a. Groove surface 106a defines a groove 108a. Groove surface 106a includes an apex 104a2 (i.e., the "peak" of groove surface, which may be "U" shaped, "V" shaped, etc.). Tip portion 104a includes two foot portions 104a1 at a terminal end of tip portion 104a.

FIG. 2C illustrates tip portion 104a after a plurality of laser scribed recesses 106a1 (e.g., laser pulsed holes) have been formed on groove surface 106a (now labeled groove surface 106a' in FIG. 2C because of the inclusion of the laser scribed recesses) in accordance with embodiments of the invention. While FIG. 2C only illustrates one wall of groove surface including the laser scribed recesses, it is understood that such laser scribed recesses may be formed on any portion of the groove surface (e.g., apex 104a2) and/or tip portion (e.g., foot portion 104a1 of the tip portion), as desired.

FIG. 2D illustrates tip portion 104a after a coating 120 is applied to tip portion 104a, including groove surface 106a' including the plurality of laser scribed recesses 106a1, apex 104a2, each foot portion 104a1, and an external surface of tip portion 104a. Although FIG. 2D illustrates a coating applied after the plurality of laser scribed recesses 106a1 have been formed, the invention is not limited thereto, as it is contemplated that coating 120 could be applied to a groove surface 106a (i.e., a groove surface with no laser scribed recesses, or a groove surface before laser scribed recesses are formed) without departing from the scope of the invention.

As illustrated in FIG. 2D, coating 120 has a thickness t. Exemplary ranges for thickness t include: 0.5-10 μm, 5-10 μm, 1-5 μm, 1-20 μm, and 10-20 μm. In exemplary embodiments of the invention, thickness t may depend on the type of coating. For example, a diamond-like carbon (DLC) coating may have an exemplary thickness of 0.5-5 μm; a cubic boron nitride (c-BN) coating may have an exemplary thickness of 10-100 μm, 1-50 μm, or 1-10 μm; a tetrahedral amorphous carbon (ta-C) coating may have an exemplary thickness of 0.5-6 μm; a titanium nitride (TiN) coating may have an exemplary thickness of 1-10 µm; a chromium nitride (CrN) coating may have an exemplary thickness of 0.2-7 µm or 1-15 µm.

Although FIG. 2D illustrates a coating applied to the entirety of tip portion 104a, the invention is not limited thereto. For example, a coating may be applied to selected portions of tip portion 104a (e.g., all or a portion of groove surface 106a, each foot portion 104a1, the external surfaces of tip portion 104a, etc.), as desired.

While FIGS. 2A-2D illustrate aspects of an overview of the invention, FIGS. 3A-3D, FIGS. 4A-4C, FIGS. 5A-5C, and FIGS. 6A-6B illustrate with more particularity the step between FIGS. 2B and 2C, wherein the plurality of laser scribed recesses are formed. In FIGS. 3A-3D, tip portion 104b of wedge bonding tool 100b is illustrated in a laser processing system 310 at the start of the formation of laser scribed recesses. Laser processing system 310 includes an optical element 312 and a laser source 314. Throughout the process illustrated in FIGS. 3A-3D, laser source 314 and optical element 312 are fixed in place.

In FIG. 3A, laser source 314 emits a laser beam 314a toward optical element 312. Optical element 312 reflects and/or focuses laser beam 314a toward a first wall portion 106b1 of a groove surface 106b of tip portion 104b. Laser beam 314a contacts first wall portion 106b1 normal to groove surface 106b (i.e., perpendicular to). Laser beam 314a removes material from first wall portion 106b1 to create a recess. Since laser beam 314a strikes first wall portion 106b1 at a right angle, the recess has a depth that extends along an axis substantially perpendicular to first wall portion 106b1.

In FIG. 3B, tip portion 104b has been moved to the left, as indicated by the arrow. Laser source 314 and optical element 312 have remained fixed, thus relative motion between laser beam 314a and groove surface 106b is achieved. During the movement, laser source 314 continued to emit laser beam 314a in pulses, with each pulse creating another laser scribed recess in first wall portion 106b1, thus creating a plurality of laser scribed recesses in first wall portion 106b1. In FIG. 3C, tip portion 104b has been moved (e.g., rotated 180°) such that laser beam 314a is now incident on a second wall portion 106b2. In FIG. 3D, tip portion 104b has been moved to the right, as indicated by the arrow. During the movement, laser source 314 continued to emit laser beam 314a in pulses, with each pulse creating a recess, thus creating a plurality of laser scribed recesses in second wall portion 106b2.

Although FIGS. 3A-3D illustrate a single optical element (i.e., optical element 312), the invention is not limited thereto. An exemplary laser processing system may include a plurality of optical elements (e.g., see FIGS. 5A-5C), including mirrors and/or lenses for controlling the laser beam (e.g., reflecting, focusing, etc.). Similarly, a laser processing system may include no optical elements at all (e.g., see FIGS. 4A-4C). Further, the invention is not limited to keeping the laser source and/or the optical element(s) fixed, as is further described below.

For example, FIGS. 4A-4C illustrate a laser processing system 410 including a laser source 414. Laser source 414 is used to form a plurality of recesses on a groove surface 106c of tip portion 104c of wedge bonding tool 100c. In FIG. 4A, laser source 414 is aligned such that a laser beam 414a, when emitted from laser source 414, will contact groove surface 106c normal to groove surface 106c (i.e., perpendicular to groove surface 106c). Laser source 414 is shown in FIG. 4A as emitting laser beam 414a to form a recess in groove surface 106c. Since laser beam 414a strikes groove surface 106c at a right angle, the recess has a depth that extends along an axis substantially perpendicular to groove surface 106c.

In FIG. 4B, laser source 414 has moved (e.g., diagonally) such that laser beam 414a is contacting another portion of groove surface 106c. Between the positions shown in FIGS. 4A and 4B, laser source 414 continued to emit laser beam 414a in pulses during the movement, with each pulse creating another laser scribed recess in groove surface 106c, thus creating a plurality of laser scribed recesses in groove surface 106c.

In FIG. 4C, laser source 414 has continued to move to complete the processing of groove surface 106c. Throughout the process illustrated in FIGS. 4A-4C, laser source 414 is aligned such that laser beam 414a contacts groove surface 106c normal to groove surface 106c. In certain embodiments, the entirety of groove surface 106c includes a plurality of laser scribed recesses, but the invention is not limited thereto-only part of the groove surface may include laser scribed recesses.

FIGS. 5A-5C illustrate another laser processing system 510. Laser processing system 510 includes a laser source 514 and optical elements 512 and 513. Laser source 514 is configured to emit a laser beam 514a. In FIG. 5A, laser source 514 is emitting laser beam 514a toward optical element 512. Optical element 512 is aligned such that it reflects laser beam 514a to contact groove surface 106d (of tip portion 104d of wedge bonding tool 100d) normal to groove surface 106d (i.e., is perpendicular to groove surface 106d). In FIG. 5B, optical element 512 has moved (e.g., upward) to direct laser beam 514a to a different location on groove surface 106d. Between FIGS. 5A and 5B, optical element 512 continued to move, as indicated by the arrow, and laser source 514 pulsed laser beam 514a to create a plurality of laser scribed recesses in groove surface 106d. In FIG. 5C, optical element 512 has moved (e.g., rotated) to reflect laser beam 514a toward optical element 513. Optical element 513 reflects laser beam 514a toward a different portion of groove surface 106d.

Although FIGS. 3A-3D, FIGS. 4A-4C, and FIGS. 5A-5C illustrate only one element of a laser processing system in motion, the invention is not limited thereto. It is within the scope of the invention for multiple elements of the laser processing machine to be moveable to create relative motion between the groove surface and the laser beam (e.g., wherein the optical elements and the laser source are in motion).

FIGS. 3A-3D, FIGS. 4A-4C, and FIGS. 5A-5C illustrate two-dimensional block diagrams of the laser scribing process. To more clearly demonstrate aspects of the invention, FIGS. 6A and 6B show a perspective view of wedge bonding tools 100e and 100f. FIG. 6A illustrates a laser source 614 and tip portion 104e of wedge bonding tool 100e. Laser source 614 is emitting a laser beam 614a toward a groove surface 106e of tip portion 104e. Laser beam 614a is contacting groove surface 106e normal to groove surface 106e (i.e., perpendicular). A motion profile 600 is illustrated on groove surface 106e. At least one of laser source 614, tip portion 104e, and an optical system (not shown) are moved to achieve relative motion between laser beam 614a and groove surface 106e (e.g., as described in any of FIGS. 3A-3D, FIGS. 4A-4C, and FIGS. 5A-5C). As relative motion occurs, laser 614 pulses laser beam 614a, wherein each pulse creates a laser scribed recess in groove surface 106e. Since laser beam 614a strikes groove surface 106e at a right angle, each recess has a depth that extends along an axis substantially perpendicular to groove surface 106e. As shown in FIG. 6A, motion (e.g., of laser beam 614a along groove surface 106*e*) is a predetermined motion profile, but the invention is not limited thereto. As shown in FIG. 6B, a motion profile 602 is implemented on a groove surface 106*f* of a tip portion 104*f.* Motion profile 602 is random (or pseudorandom).

Various methods described herein result in a wedge bonding tool with a plurality of laser scribed recesses on at least a portion of the groove surface. The portion of the groove surface including the plurality of laser scribed recesses has a surface texture. In accordance with exemplary embodiments of the invention, the surface texture may have a mean area roughness ($S_a$). Exemplary ranges for the mean area roughness ($S_a$) are: 0.03-1.5 μm, 0.1-0.9 μm, and 0.3-1.5 μm. Specific embodiments may have differing $S_a$ ranges. For example, a wedge bonding tool including a cubic boron nitride (c-BN) tip portion may have an exemplary $S_a$ of 0.1-0.9 μm, 0.3-1.5 μm, or 0.4-1.5 μm. A wedge bonding tool including a carbide (e.g., tungsten carbide) tip may have an exemplary $S_a$ of 0.03-0.15 μm, 0.1-0.9 μm, 0.3-1.5 μm, or 0.4-1.5 μm. The range for $S_a$ for a particular tool may be selected for particular applications (e.g., different ranges may be desirable for bonding a copper wire than ranges for bonding an aluminum wire). Other ranges for the mean area roughness ($S_a$) are contemplated. The recesses may have a depth, for example, that is at least ten times larger than its width/diameter.

In connection with aspects of the invention, material is typically removed from the groove surface to form the plurality of laser scribed recesses. By removing this material, a plurality of "peaks" are formed in the surface texture of the groove surface. For example, each of the plurality of peaks included in the groove surface may have a width of 2-50 μm. The combination of the plurality of laser scribed recesses and the resultant plurality of peaks may be considered to define a surface texture of the processed area of the groove surface.

Although aspects of the invention have been described as having a single surface texture, the invention is not so limited. It is contemplated that a wedge bonding tool could have a portion of the groove surface having a first surface texture, and another portion of the groove surface has a second surface texture different from the first surface texture (e.g., the first surface texture has a different mean area roughness than the second surface texture, etc.).

Figure 7:
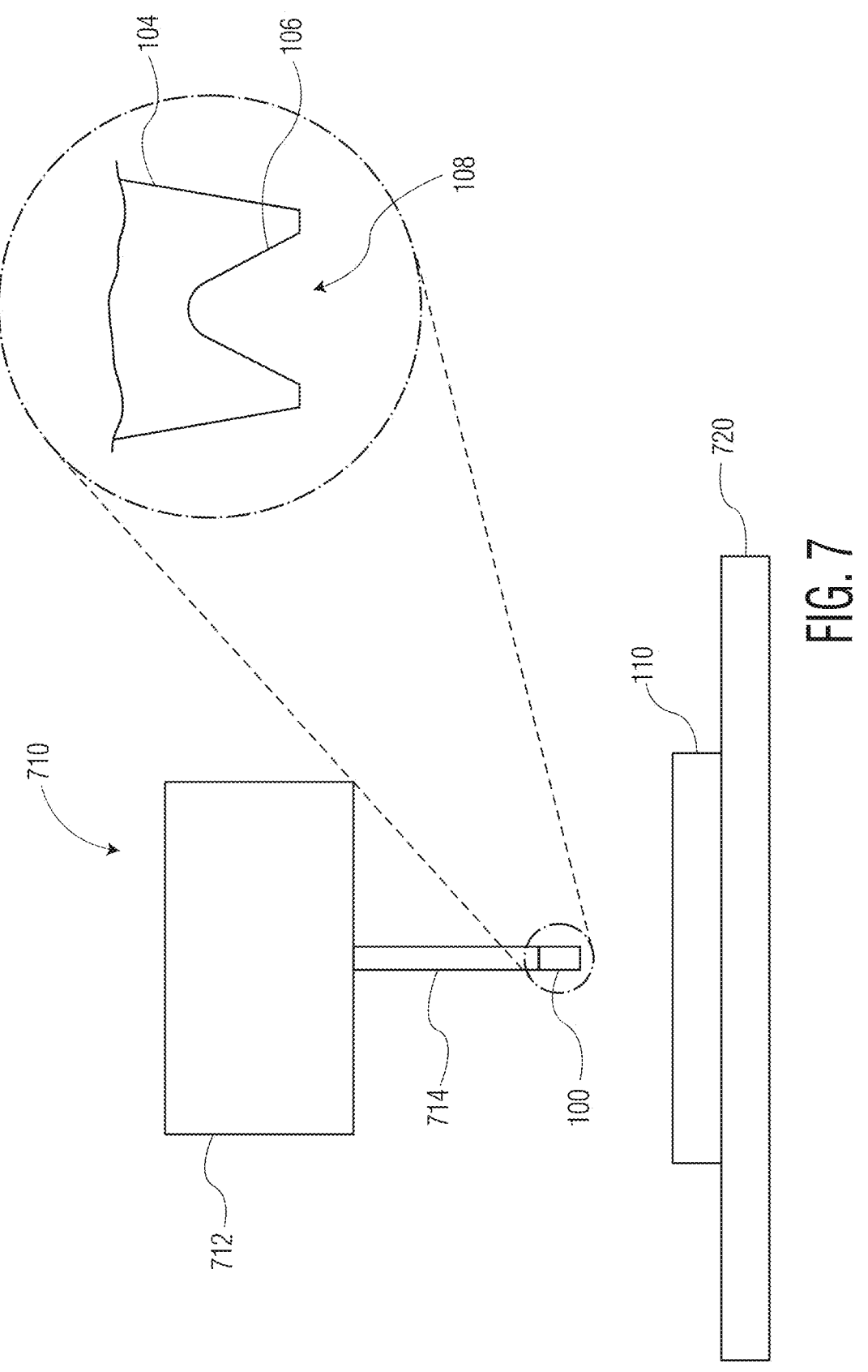
FIG. 7 is a block diagram illustrating of a wire bonding system in accordance with an exemplary embodiment of the invention.

Wedge bonding tools described herein, or otherwise within the scope of the invention, may be used in connection with a wire bonding operation on a wire bonding system. FIG. 7 illustrates an exemplary wire bonding system 710. Wire bonding system 710 includes a bond head assembly 712 and a support structure 720. Support structure 720 is illustrated supporting a workpiece 110 (e.g., a semiconductor element, a die, etc.). Bond head assembly 712 includes a transducer 714 configured to receive wedge bonding tool 100 (e.g., any of wedge bonding tools 100*a*, 100*b*, 100*c*, 100*d*, 100*e*, 100*f*, or any other wedge bonding tool within the scope of the invention). Wedge bonding tool 100 is configured to be carried by bond head assembly 712, wherein wedge bonding tool 100 includes body portion 102 and tip portion 104 at a terminal end of body portion 102. Tip portion 104 includes groove surface 106 defining groove 108 configured to receive a wire during the wire bonding operation, and groove surface 106 includes a plurality of laser scribed recesses (not illustrated). Each of the laser scribed recesses, as described above, have a depth that extends along an axis substantially perpendicular to groove surface 106.

In connection with the methods of forming a wedge bonding tool described in FIGS. 2A-2D, 3A-3D, 4A-4C, 5A-5C, and 6A-6B, a flow diagram is provided in FIG. 8. As is understood by those skilled in the art, certain steps included in the flow diagram may be omitted; certain additional steps may be added; and the order of the steps may be altered from the order illustrated-all within the scope of the invention.

Referring now to FIG. 8, at optional Step 800, a groove is formed at a tip portion of a terminal end of a tool blank using a laser (e.g., see FIGS. 2A-2B). At Step 802, a wedge bonding tool is provided, or, if Step 800 is performed, the wedge bonding tool from Step 800 is provided. The provided wedge bonding tool, whether from Step 800 or otherwise, has a body portion and a tip portion at a terminal end of the body portion. The tip portion includes a groove surface defining a groove, and the groove is configured to receive a wire during a wire bonding operation. At Step 804, a plurality of recesses are formed in the groove surface using a laser beam (e.g., see the process of each of FIGS. 2A-2D, 3A-3D, 4A-4C, 5A-5C, and 6A-6B). In Step 804, the laser beam contacts the groove surface normal to the groove surface to form each of the plurality of recesses; however, it is understood that according to certain embodiments of the invention the laser beam may contact the groove surface at a different angle. At optional Step 806, a coating (e.g., a low friction coating, a wear resistant coating, etc.) is applied to the groove surface after Step 804.

Laser systems may be used in connection with the invention to form the plurality of recesses in the groove surface in many different ways. For example, laser parameters may be selected based on a number of variables such as, for example, the material of the tip portion of the wedge bonding tool, the desired depth/size of each recess, etc. Examples of such laser parameters include, for example, a pulse frequency, a pulse duration, an amplitude, a wavelength, etc. The specific laser parameters used to form a given plurality of recesses in a specific wedge bonding tool may be considered as a laser recipe. As will be appreciated by those skilled in the art, multiple different laser recipes may be used in connection with the processing of a groove surface of a wedge bonding tool such that a desired surface texture is achieved.

Aspects of the invention are described with respect to a wedge bonding tool including (i) a body portion and (ii) a tip portion at a terminal end of the body portion. As will be appreciated by those skilled in the art, such a wedge bonding tool may be formed from a unitary piece of material (e.g., a carbide material such as tungsten carbide) or multiple pieces of material. For example, the multiple pieces of material may include a body portion formed of a first material (e.g., a carbide material such as tungsten carbide) and a tip portion formed of a second material (e.g., cubic boron nitride or any other applicable material). In such an example, the tip portion may be coupled to the body portion using any desired technique (e.g., brazing).

Although the invention is illustrated and described herein with reference to specific embodiments, the invention is not intended to be limited to the details shown. Rather, various modifications may be made in the details within the scope and range of equivalents of the claims and without departing from the invention.

What is claimed:
 1. A wedge bonding tool comprising:
 a body portion; and a tip portion at a terminal end of the body portion, the tip portion including a groove surface defining a groove, the groove being configured to receive a wire during a wire bonding operation, wherein the groove surface includes a plurality of laser pulsed holes, wherein each of the plurality of laser pulsed holes extends along an axis substantially perpendicular to the groove surface, and wherein a depth of each of the plurality of laser pulsed holes along the axis is at least ten times larger than a width of each of the plurality of laser pulsed holes.

2. The wedge bonding tool of claim 1 wherein a portion of the groove surface including the plurality of laser pulsed holes has a surface texture, the surface texture having a mean area roughness (Sa) of 0.03-1.5 μm.

3. The wedge bonding tool of claim 1 wherein a portion of the groove surface including the plurality of laser pulsed holes has a surface texture, the surface texture having a mean area roughness (Sa) of 0.1-0.9 μm.

4. The wedge bonding tool of claim 1 wherein a portion of the groove surface including the plurality of laser pulsed holes has a surface texture, the surface texture having a mean area roughness (Sa) of 0.3-1.5 μm.

5. The wedge bonding tool of claim 1 further comprising a coating applied to the groove surface.

6. The wedge bonding tool of claim 1 wherein the groove is U shaped or V shaped.

7. The wedge bonding tool of claim 1 wherein a portion of the groove surface including the plurality of laser pulsed holes has a surface texture, wherein a plurality of peaks included in the portion of the groove surface each have a width of 2-50 μm.

8. A wedge bonding tool comprising:

a body portion;

a tip portion at a terminal end of the body portion, the tip portion including a groove surface defining a groove, the groove being configured to receive a wire during a wire bonding operation, the groove surface includes a plurality of laser pulsed holes; and a coating applied to the groove surface, wherein each of the plurality of laser pulsed holes extends along an axis substantially perpendicular to the groove surface, and wherein a depth of each of the plurality of laser pulsed holes along the axis is at least ten times larger than a width of each of the plurality of laser pulsed holes.

9. The wedge bonding tool of claim 8 wherein a portion of the groove surface including the plurality of laser pulsed holes has a surface texture, the surface texture having a mean area roughness (Sa) of 0.03-1.5 μm.

10. The wedge bonding tool of claim 8 wherein a portion of the groove surface including the plurality of laser pulsed holes has a surface texture, the surface texture having a mean area roughness (Sa) of 0.1-0.9 μm.

11. The wedge bonding tool of claim 8 wherein a portion of the groove surface including the plurality of laser pulsed holes has a surface texture, the surface texture having a mean area roughness (Sa) of 0.3-1.5 μm.

12. The wedge bonding tool of claim 8 wherein the groove is U shaped or V shaped.

13. The wedge bonding tool of claim 8 wherein a portion of the groove surface including the plurality of laser pulsed holes has a surface texture, wherein a plurality of peaks included in the portion of the groove surface each have a width of 2-50 μm.

14. The wedge bonding tool of claim 8 wherein a portion of the groove surface including the plurality of laser pulsed holes has a first surface texture, and another portion of the groove surface has a second surface texture different from the first surface texture.

15. The wedge bonding tool of claim 8 wherein the coating includes a diamond-like carbon material.

16. The wedge bonding tool of claim 8 wherein the coating includes a cubic boron nitride material.

17. The wedge bonding tool of claim 8 wherein the coating includes titanium nitride material.

18. The wedge bonding tool of claim 8 wherein the coating includes a chromium nitride material.

19. The wedge bonding tool of claim 8 wherein the coating has a thickness of 0.5-10 μm.

20. The wedge bonding tool of claim 8 wherein the coating has a thickness of 1-20 μm.

* * * * *